(12) United States Patent
Hembree

(10) Patent No.: US 7,167,010 B2
(45) Date of Patent: Jan. 23, 2007

(54) PIN-IN ELASTOMER ELECTRICAL CONTACTOR AND METHODS AND PROCESSES FOR MAKING AND USING THE SAME

(75) Inventor: David R. Hembree, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/933,745

(22) Filed: Sep. 2, 2004

(65) Prior Publication Data

US 2006/0043986 A1  Mar. 2, 2006

(51) Int. Cl.
*G01R 31/02* (2006.01)
(52) U.S. Cl. .................. 324/754; 324/755; 324/765
(58) Field of Classification Search .............. None
See application file for complete search history.

(56) References Cited

U.S. PATENT DOCUMENTS

| | | | | |
|---|---|---|---|---|
| 4,473,798 A | * | 9/1984 | Cedrone et al. | ............. 324/754 |
| 5,670,889 A | * | 9/1997 | Okubo et al. | ................ 324/760 |
| 6,229,322 B1 | * | 5/2001 | Hembree | .................... 324/755 |
| 6,351,133 B1 | | 2/2002 | Jones et al. | |
| 6,462,575 B1 | | 10/2002 | Cram | |
| 6,466,043 B2 | | 10/2002 | Khoury et al. | |
| 6,472,890 B2 | | 10/2002 | Khoury et al. | |
| 6,475,822 B2 | | 11/2002 | Eldridge et al. | |
| 6,535,012 B1 | | 3/2003 | Wood et al. | |
| 6,535,033 B2 | | 3/2003 | Aldaz et al. | |
| 6,579,804 B1 | | 6/2003 | Zhou et al. | |
| 6,830,460 B1 | * | 12/2004 | Rathburn | ..................... 439/66 |
| 6,953,348 B2 | * | 10/2005 | Yanagisawa et al. | ......... 439/66 |

FOREIGN PATENT DOCUMENTS

EP          0 677 745 A1    8/1995
WO         WO 97/43653     11/1997

* cited by examiner

*Primary Examiner*—Minh N. Tang
(74) *Attorney, Agent, or Firm*—Trask Britt

(57) ABSTRACT

A contactor card assembly for use with a semiconductor substrate. An upper keeper plate and a lower keeper plate each include a number of conductive pins extending therethrough, situated in vias filled with an elastomeric material and extending beyond the keeper plates to contact a substrate for testing. An intermediate keeper plate is situated between the upper and lower keeper plates and includes conductive pivot bars in channels filled with elastomeric material. Each conductive pin contacts a pivot bar on one side thereof to electrically communicate with a corresponding pin on the opposite side. Under compression, variations in the height of contacts on the substrate under test are adjusted for by the movement of the pins and pivoting of the pivot bar in the elastomeric material. Methods and process for creating the keeper plates and semiconductor and testing assemblies are also included in the present invention.

23 Claims, 7 Drawing Sheets

PIN-IN ELASTOMER ELECTRICAL CONTACTOR AND METHODS AND PROCESSES FOR MAKING AND USING THE SAME

BACKGROUND OF THE INVENTION

1. Field of the Invention

The present invention relates generally to methods and apparatus in the field of probe cards and contact cards for testing semiconductor substrates. More specifically, the present invention relates to methods and apparatus in the field of probe and contact cards that compensate for variation in the height of contacts on the semiconductor substrate under test.

2. State of the Art

For burn-in testing of semiconductor substrates, an electrical connection must be established from the contacts on the substrate to the testing device. Often a section of printed circuit board (PCB) with contacts corresponding to the substrate under test is connected to the testing device and used to make contact with the substrate. Typically the PCB is made of low cost PCB material, which creates difficulties in making it planar and also has different thermal expansion properties than the substrate under test. Typically, probe cards, or contact cards have been used to make contact from the PCB to the substrate under test to compensate for such problems.

Variation in height of the contacts of the semiconductor substrate under test, such as where the semiconductor substrate includes mounting or interconnect structures, including under bump metallization, redistribution lines, solder balls, or other connections, can result in probe cards having difficulty making and maintaining good contact. For example, as described in U.S. Pat. No. 6,535,012, in a reusable test fixture for burn-in testing, the variation in the height of contacts of a semiconductor substrate is compensated by a portion of the reusable test fixture that uses contact tips or flexible contact tips for contacting the contacts on semiconductor devices and contacts on a wafer. If desired, an elastomeric mat having conductive patterns thereon corresponding to conductive pads or contact areas on the wafer may be used with flexible contact tips on a portion of the reusable burn-in fixture.

In another example, the variation in the height of contacts of a semiconductor substrate is compensated by a probe card used in a test assembly that may have a number of contact pins or needles extending from it on one side that contact the PCB and an opposite set that contact the semiconductor substrate under test. The individual pins or needles are typically co-planar. In compressing the testing assembly to make contact with the semiconductor substrate under test, the probe card may lose co-planarity to make contact with either the semiconductor substrate under test, resulting in poor alignment with the opposite set resulting in the problems during testing of current leak, poor connections, missing connections, etc.

One attempt to deal with these problems has been the use of "pogo" or spring loaded pins in a probe card. In the testing assembly, a keeper plate has a plurality of pogo pins, each pogo pin having a top side, a bottom side and a central sleeve containing the springs, inserted into holes in the keeper plate. One end of each pogo pin corresponds to a contact on the semiconductor substrate under test, while the opposite end corresponds to contact on the PCB. Such a keeper plate can adjust for some variation in the height of the contacts. However, each pogo pin has a cost of approximately $1.00, and must be assembled in the keeper plate. For a wafer-sized keeper plate, between 11,500 and 12,000 or more pogo pins may be needed. As such, the costs in materials and labor to manufacture such a keeper plate for a test assembly are significant.

Accordingly, a test apparatus or test system must have the pins in a probe card capable of compensating of any height variations of the contacts of a semiconductor substrate under test. Preferably, such a test apparatus or test system needs to be readily manufactured using standard micromachining or wafer handling techniques. Such a test apparatus or test system must be conveniently scalable from single semiconductor die testing to wafer-level testing.

BRIEF SUMMARY OF THE INVENTION

The present invention comprises a contact card for contacting the contacts of a semiconductor substrate, such as a semiconductor die or wafer having a plurality of semiconductor dice for testing and burn-in.

BRIEF DESCRIPTION OF THE DRAWINGS

In the drawings, which, in conjunction with the accompanying description of the invention, disclose the various embodiments of the invention.

DETAILED DESCRIPTION OF THE ILLUSTRATED EMBODIMENTS

The present invention comprises a method and apparatus for a contactor card assembly for the probe testing and burn-in testing of semiconductor dies and wafers. It will be appreciated that the invention is illustrated by the various embodiments of the invention described herein. It will be understood that various combinations or modifications of the disclosed embodiments of the invention may be made without departing from the scope of the invention.

Figure 1:
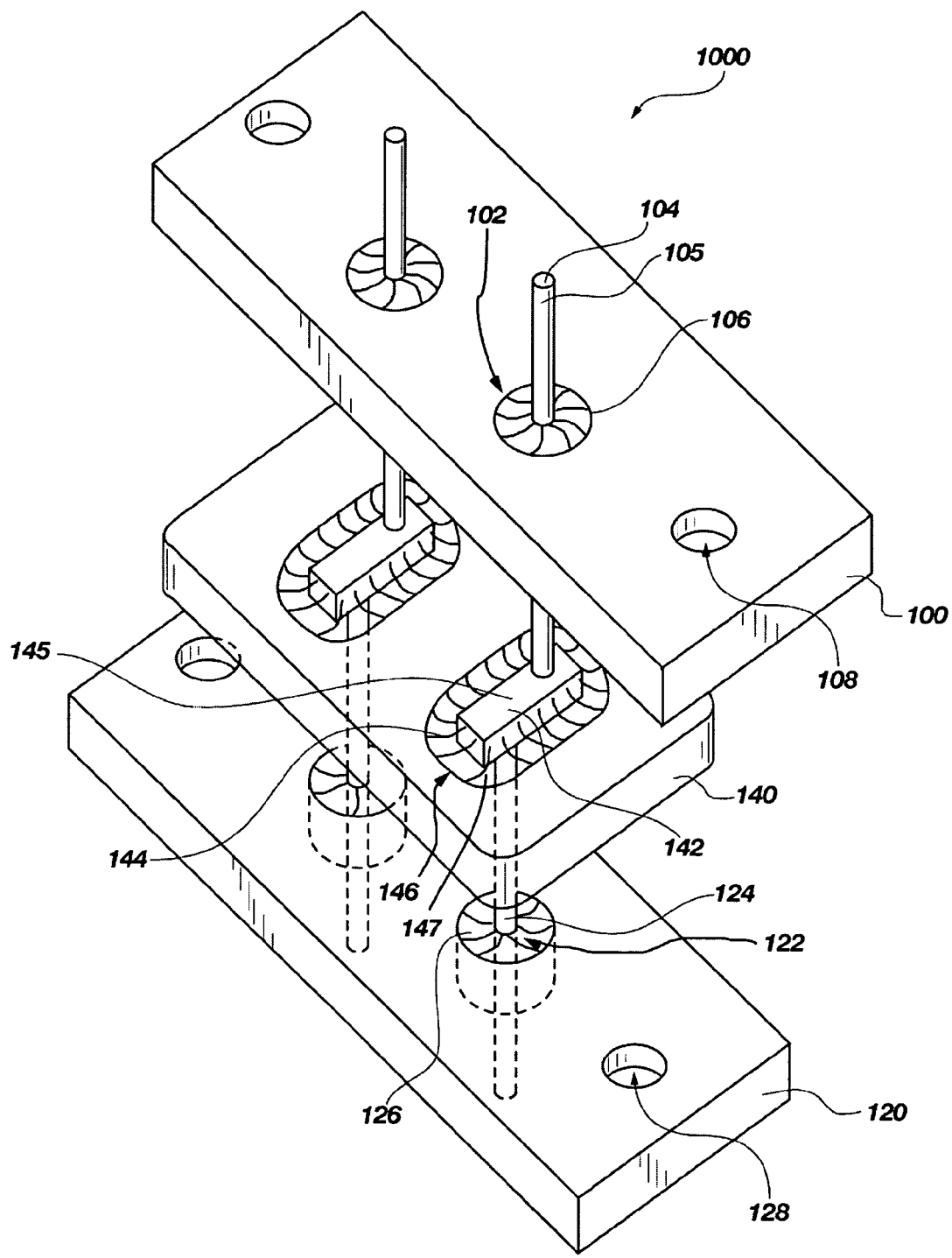
FIG. 1 is a perspective view of one embodiment of a contactor card assembly for testing and burn-in in accordance with the principles of the present invention.

Illustrated in drawing FIG. 1 is an embodiment of a contactor card assembly 1000 of the present invention. An upper keeper plate 100 includes a plurality of vias 102 therethrough. Each via 102 contains an electrically conductive upper connector or contact pin 104 having a shaft 105, a portion (not shown) of which is surrounded by a resilient, flexible upper elastomer 106 that retains the upper connector pin 104 therein, yet allows the pin 104 to move in any direction along its longitudinal axis as the elastomer 106 flexes. Upper connector pin 104 and the upper elastomer 106 are described in more detail herein. Upper keeper plate 100 may contain holes 108 for visual and mechanical alignment of semiconductor substrates or other structures in using the assembly 1000, including alignment of the upper keeper plate 100 to intermediate keeper plate 140 and lower keeper plate 120, as well to external testing device fixtures.

Similar to the upper keeper plate 100, a lower keeper plate 120 includes a plurality of vias 122 therethrough. Each via 122 containing an electrically conductive lower connector or contact pin 124, which is surrounded by a resilient, flexible lower elastomer 126 that retains the lower connector pin 124 therein while allowing the connector pin 124 to move in any direction along its longitudinal axis as the lower elastomer 126 flexes. The lower keeper plate 120 may contain lower alignment holes 128 for visual and mechanical alignment of semiconductor substrates or other structures in using the assembly 1000. Lower keeper plate 120 and upper keeper plate 100 are manufactured in the same manner from the similar or the same materials, differing only in the placement of the upper and lower connective pins 104 and 124.

An intermediate keeper plate 140 may be disposed between the upper keeper plate 100 and lower keeper plate 120. An electrically conductive pivot bar 142 is contained in a resilient, flexible elastomer 144 disposed in a channel 146 passing through the intermediate keeper plate 140. At least a portion of the top surface 145 and bottom surface 147 of the electrically conductive pivot bar 142 remain exposed from the elastomer 144.

An upper connector pin 104 extending from the upper keeper plate 100 contacts the pivot bar 142 on its upper surface 145, at a point along its horizontal axis away from the midpoint of the pivot bar 142. A lower connector pin 124 extends upward from the bottom keeper plate 120 to contact the lower surface 147 at a point along its horizontal axis away from the midpoint of the pivot bar 142, in a direction opposite the contact of the upper connector pin 104 on the upper surface 145. The support structure 1002 for supporting the keeper plates and maintaining the relationship therebetween is illustrated in dashed lines in drawing FIGS. 2 and 3.

Figure 2:
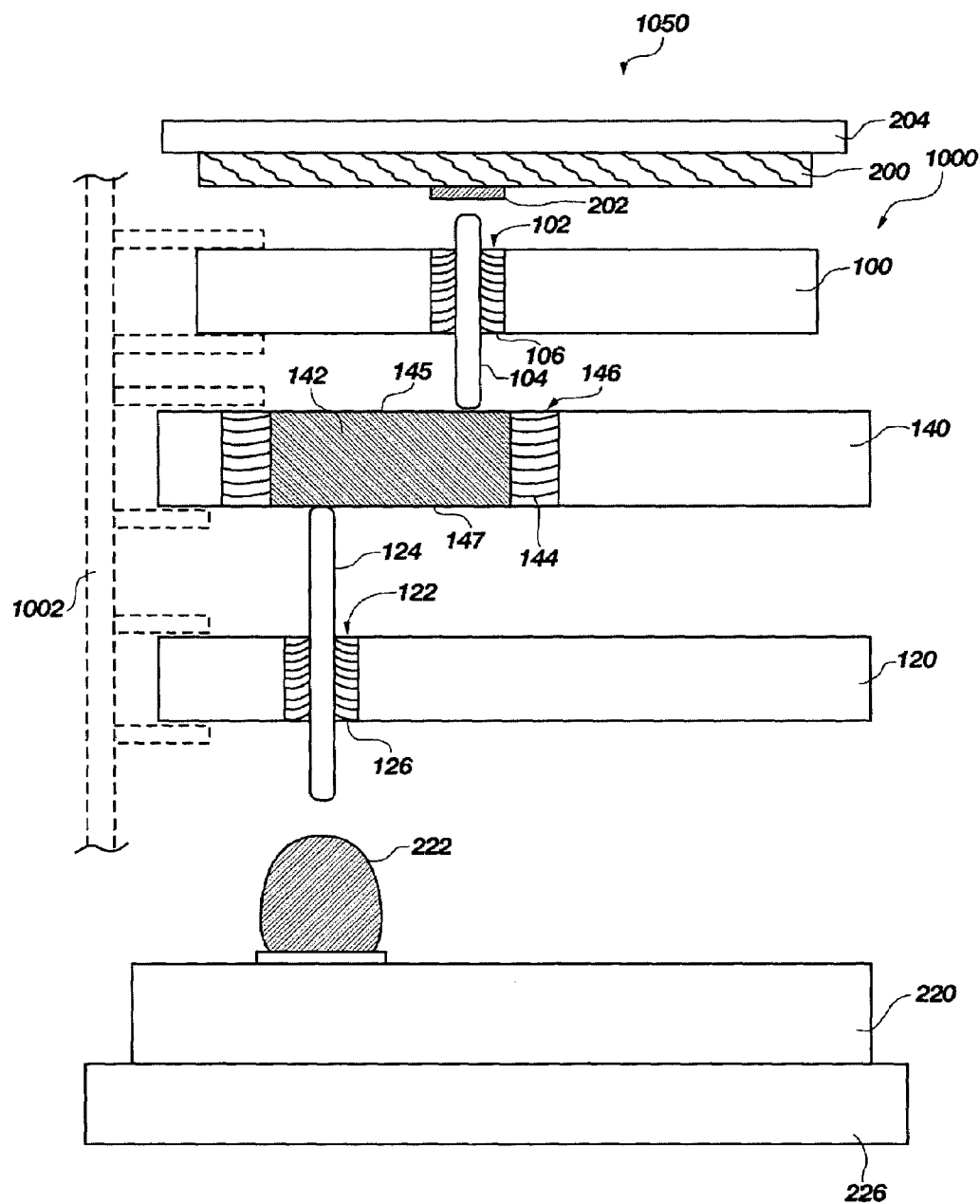
FIG. 2 is a side view of the contactor card assembly of FIG. 1, shown in an uncompressed condition and in relation to a semiconductor package and tester for testing of the semiconductor package, in accordance with the principles of the present invention.
Figure 3:
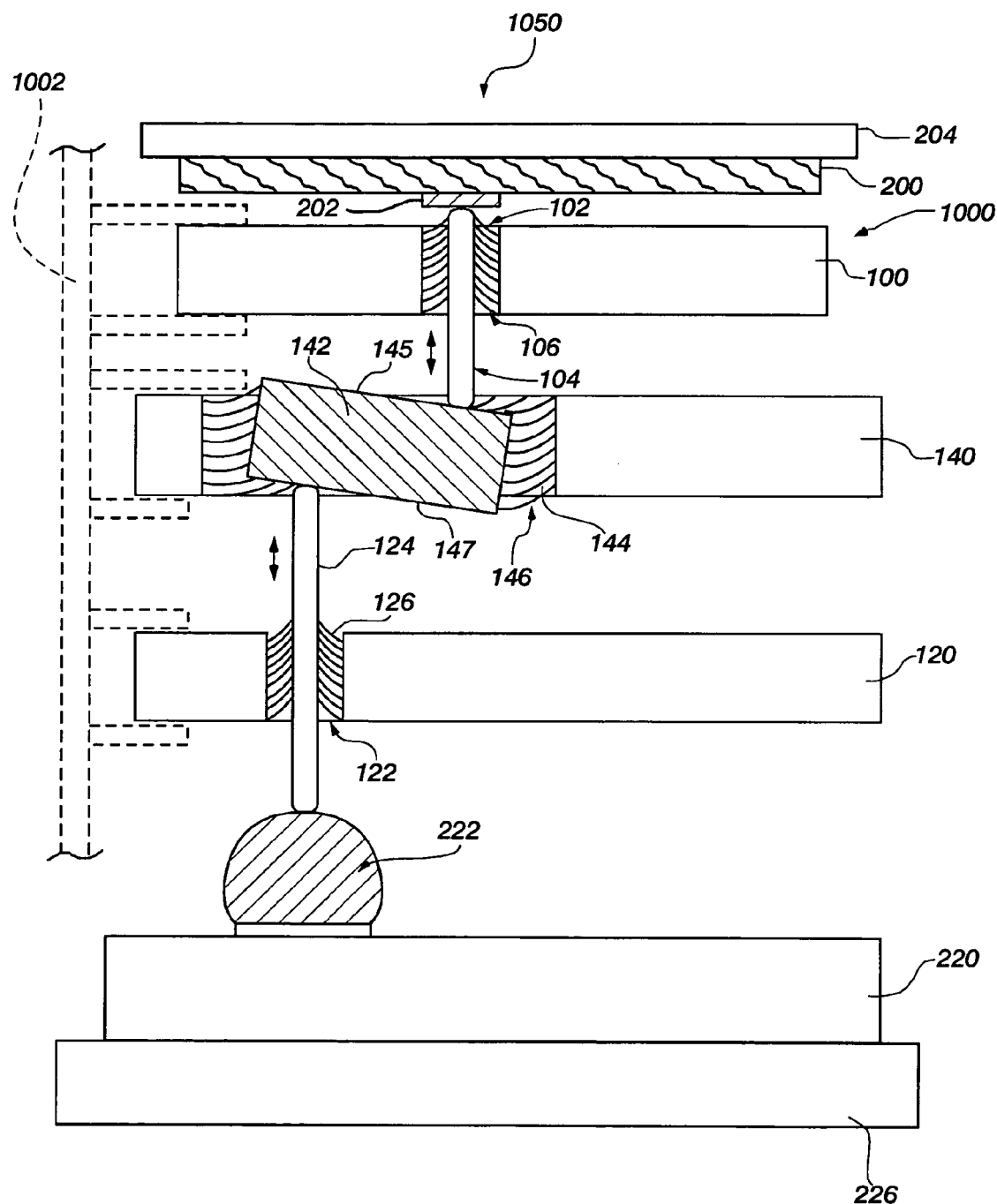
FIG. 3 is a side view of the contactor card assembly of FIGS. 1 and 2, shown in compressed condition and in relation to a semiconductor package and tester for testing of the semiconductor package, in accordance with the principles of the present invention.
Figure 4:
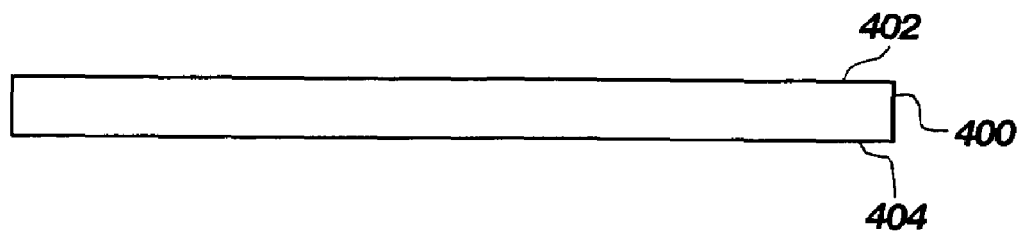
FIG. 4 is a side view of a semiconductor substrate, useful for forming a portion of the contactor card assembly of FIG. 1, in accordance with the principles of the present invention.

Turning to drawing FIGS. 2 and 3, the contactor card assembly 1000 is shown in relationship to a semiconductor substrate 220 to be tested in a testing device 1050. A printed circuit board 200 or other testing substrate is mounted on an upper backing plate 204 and contains at least one contact 202 on the surface thereof. An upper connection pin 104 aligns with the contact 202 in an uncompressed position. The semiconductor substrate 220 undergoing testing or burn-in is disposed on a backing plate 226 located beneath the lower keeper plate 120. Semiconductor substrate 220 may be a semiconductor die, a semiconductor assembly (such as a packaged die), a semiconductor wafer containing multiple die sites or another substrate containing an integrated circuit to be tested. An electrical contact 222, such as a solder ball on a semiconductor assembly or a bond pad on a semiconductor die, is aligned with the lower connective pin 124 corresponding to the upper connective pin 104 aligned with the appropriate contact 202 on the PCB 200.

As the testing device is compressed to bring the connector pins 104 and 124 in contact with the electrical contact 222 and the contact 202, the contactor card assembly 1000 conforms to the contacts as illustrated in drawing FIG. 3. The upper and lower connector pins 104 and 124 are able to move in a direction along their longitudinal axes to engage the contact 202 and electrical contact 222 with sufficient force to establish and maintain electrical communication therebetween. Where the electrical contacts 222 on the substrate 220 are of different heights, such as an array of solder balls disposed on the under bump metallization (UMB) of a wafer or die having variations in height across the array, contact may be maintained in an effective manner. In some embodiments, appropriately sized upper and lower electrical contact pins 104 and 124 may be used to allow proper contact to be made to electrical contacts 222 on a substrate 220 that includes contact pads that have conductive bumps, such as solder balls, attached thereto and non-bumped pads, such as wire bond pads. Additionally, in some embodiments, appropriately sized upper and lower electrical contact pins 104 and 124 may be used to allow proper contact to be made to electrical contacts 222 on a substrate 220, that is a stacked semiconductor die package having electrical contacts 222 on different levels of the package corresponding to the differing semiconductor dice.

Pivot bar 142 moves within the channel 146 in response to the forces placed upon it by the upper and lower connector pins 104 and 124. The elastomer 144 flexes to allow the pivot bar 142 a range of motion while retaining it in the channel 146. As illustrated in drawing FIG. 3, the pivot bar 142 can twist, yaw, tilt or roll, in reaction to the forces placed upon it. Where a number of pivot bars 142 are used, each corresponding to an individual contact of an array, the ability of each pivot bar 142 to act independently of the others allows contact to be made from contact 202 to the electrical connection 222 across a varying distance. Compression sufficient to allow testing and burn-in of an integrated circuit can be established, while neither PCB 200 nor semiconductor substrate 220 need be maintained in exactly parallel planes to avoid problems from non-co-planarity of the contacts. In some embodiments of the invention, variation of up to about 100 μm can be tolerated across an array of contacts. It will be appreciated that for embodiments where appropriately sized upper and lower electrical contact pins 104 and 124 are used to allow proper contact to be made to electrical contacts 222 on a substrate 220 with bumped and non-bumped contact pads, or substrates 220 that are stacked semiconductor packages, this variation may refers to variations from the theoretically expected position of such contacts, and, even larger variations may be tolerated.

Turning to drawing FIGS. 4 through 8, one embodiment of a process in accordance with the present invention for creating a keeper plate 420 with conductive contact pins 430 extending therethrough is illustrated. A plate substrate 400 having a generally planar shape and including upper surface 402 and lower surface 404 may be used, as illustrated in drawing FIG. 4. Plate substrate 400 may comprise any material capable of supporting the additional structures. For example, a substrate comprising primarily silicon, as formed in the art by growing a single crystal wafer in the form of a cylinder, which is then segmented or sliced, such as a wafer, may be used. Alternatively, another bulk semiconductor substrate may be employed, such as silicon-on-sapphire (SOS) substrate or a silicon-on-glass (SOG) substrate, or other type of silicon-on-insulator (SOI) substrate. Other substrates that may be used as the plate substrate 400 include printed circuit board (PCB), metallic plates, ceramics or polymeric materials formed into a substrate. Additional suitable substrates may include photosensitive and metallizable patterned glass materials, such as FOTURAN® photo-etchable glass available from SCHOTT North America, and copper-coated Invar™ alloy (which may be finished with gold coating). In any event, the selected plate substrate 400 may have a coefficient of thermal expansion similar to the testing substrate or substrate under test, to reduce the possibility of damage during a testing and burn-in procedure.

In order to allow processing with currently available equipment, plate substrate 400 may be a wafer or may be sized as a conventional semiconductor wafer, allowing for handling and processing. The plate substrate 400 may have any suitable shape, so long as a substantially planar top surface 402 and a substantially planar bottom surface 404 are maintained. Plate substrate 400 may thus be formed as a planar disk or a planar polygonal substrate. All such alternative structures are within the scope of the present invention.

Figure 5:
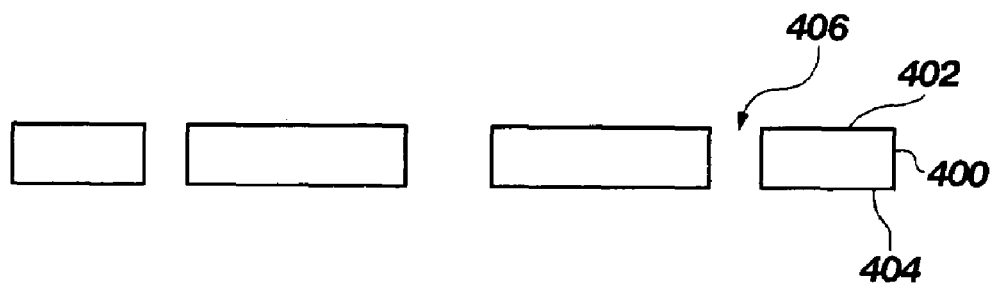
FIG. 5 is a side view of the semiconductor substrate of FIG. 4, having a via therein.

At least one via 406 may be formed through the plate substrate 400, extending from the top surface 402 to the bottom surface 404, as illustrated in drawing FIG. 5. The at least one via 406 may be formed in any suitable fashion known to those of ordinary skill in the art. For example, the at least one via 406 may be formed by laser ablation. Laser ablation may be effected using any suitable equipment, such as the Model 5000-series lasers, offered currently by ElectroScientific Industries (ESI) of Portland, Oreg. One specific, suitable piece of equipment is a 355 nm wavelength UV YAG laser, ESI Model 2700, which may be used to form vias as little as 25 μm in diameter. One hundred pulses using this laser will form a 750 μm deep via through silicon. Another suitable laser is the Model 200, offered by Xsil Limited of Dublin, Ireland. Alternatively, one or more vias 406 may be formed by etching (comprising wet etching, dry etching and either isotropic etching or anisotropic etching), by drilling or boring with a mechanical drill bit, or otherwise as known to those of ordinary skill in the art. Guide holes (such as those illustrated as 108 and 128 in drawing FIG. 1), and any other desired structures, may be formed in the plate substrate 400 at this time.

Figure 6:
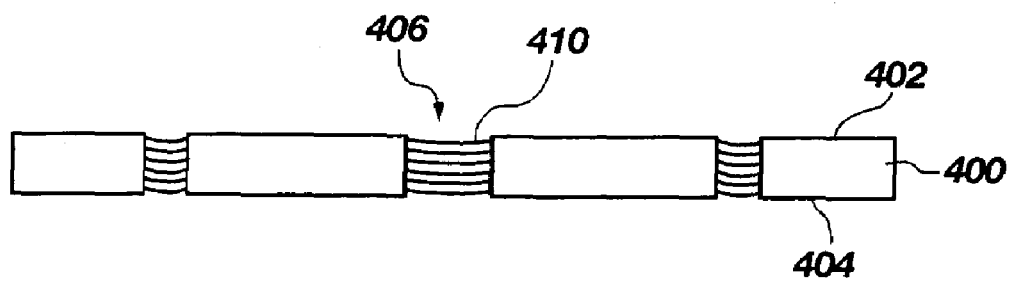
FIG. 6 is a side view of the semiconductor substrate of FIG. 5, wherein the via is filled with an elastomer in accordance with one aspect of the present invention.

Once via 406 is complete, and if necessary cleaned, it may then be filled with an elastomeric material 410, as illustrated in drawing FIG. 6. Any suitable elastomeric material, which may be dispensed into via 406 and retain an inserted connector pin therein may be used. The technique for filling via 406 will vary based on the elastomeric material 410 chosen. For example, a liquid elastomeric material may be dispensed directly into a via 406 and then cured. A liquid or gelatinous elastomeric material may be dispensed on the upper surface 402 of the plate substrate 400 and a squeegee or other scraper pulled across the surface to push the elastomeric material 410 into the vias 406. Once the vias 406 are filled with the elastomeric material 410, the elastomeric material may be cured by baking, by photo curing or any other type of curing appropriate for the selected material.

Suitable elastomeric materials 410 may include electrically insulative material to isolate the connective pin from the plate substrate 400. One example of a suitable material is liquid silicone, which may be cured to a flexible state. The cured hardness of the elastomeric material 410, as well as the thickness and cross-sectional area, may be selected to result in a spring force on the connective pin sufficient to ensure good contact. Via 406 may be filled with the plate substrate 400 attached to an underlying chuck plate to provide a bottom to the via 406, or may be performed with via 406 openings exposed to allow for over-deposition of the elastomeric material 410, where desired. In embodiments of the invention where the plate substrate 400 is constructed of a non-conductive material, a conductive elastomer may be used to facilitate current flow across the substrate 400, while preventing leakage between vias 406. It will be appreciated that in embodiments where the plate substrate 400 is a conductive material, the conductive material may be used to electrically bias the final assembly to improve performance (i.e., the material may be shorted to a ground to act as a ground plane, or biased with voltage to facilitate testing).

Figure 7:
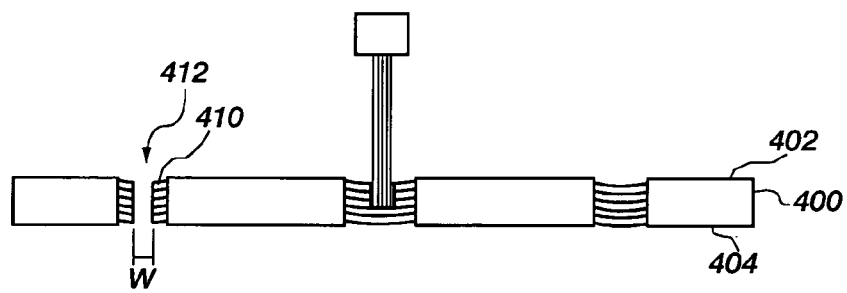
FIG. 7 is a side view of the semiconductor substrate of FIG. 6, undergoing laser ablation in accordance with the principles of the present invention.

As illustrated in drawing FIG. 7, a pin hole 412 may then be bored through the elastomeric material 410 contained in the via 406. As with via 406, formation may be accomplished with a cutting laser by ablation. A micromachining laser, such as an Xsil laser, may be useful for performing this operation. Where appropriate, the pin hole 412 may be formed by other suitable means, such as by etching, drilling or boring with a mechanical drill bit, punching, by combining any of these means with each other or laser ablation, or as otherwise known to those of ordinary skill in the art. The bore of pin hole 412 has a width W. In embodiments where pin hole 412 has a circular cross section, width W will correspond to the diameter of the pin hole 412.

Figure 8:
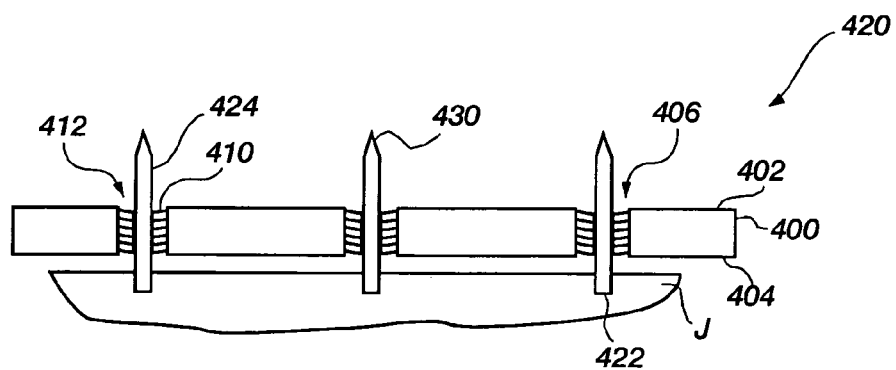
FIG. 8 is a side view of the semiconductor substrate of FIG. 7 with a conductive pin inserted therein to form a portion of a conductor card assembly in accordance with the principles of the present invention.

As illustrated in FIG. 8, a conductive contact pin 430 may then be inserted into the pin hole 412, and may serve as the connector pins 104 and 124 illustrated in drawing FIGS. 1 through 3. The conductive contact pin 430 may be an elongated conductive shaft 424, which will extend out from the plate substrate 400 to contact the structure under test and a pivot bar 142. The proximal end 422 (designated as the end that will contact the pivot bar 142) may be rounded to facilitate the movement of the pivot bar 142 during operation. The distal contact end of the conductive contact pin 430 may be flat, rounded, crowned, pointed, or have any other shape that is desired and suitable for the intended application. The shaft 424 of the contact pin 430 may have a cross-sectional width greater than the width W of the bore of pin hole 412, allowing the elastomeric material 410 to retain the conductive contact pin 430 in the pin hole 412. Placement of the conductive contact pin 430 may be facilitated by use of a jig J to retain a conductive contact pin 430 in proper position during placement. Where a number of conductive contact pins 430 are used, the jig J may hold the conductive contact pins 430 in correct alignment, allowing the insertion of the entire plurality at one time. The protrusion of the conductive contact pin 430 from the substrate 400 may also be controlled by the use of the jig J, or through machine placement of the pin.

The conductive contact pin 430 may be constructed of any suitable electrically conductive material. For example, a section of copper wire that is plated with gold or a gold wire that is plated with nickel then flash coated with a thin layer of gold may be used. In certain embodiments of the invention, the conductive contact pins 430 may be constructed by patterning vias in a wafer or a thick resist layer and then coating the vias with a seed layer, followed by plating the vias with a conductive material, such as copper. The vias may be plated until conductive material is added to form pins of sufficient depth.

One advantage of placing the conductive contact pins 430 into a bore of a pin hole 412 in cured elastomeric material is that the conductive contact pins 430 may be removed and replaced should failure occur. Additionally, the chance of pin contact areas becoming contaminated is lessened compared to placing the conductive contact pins 430 in the vias 406, followed by filling the vias with an elastomer that is then cured. It will, however be appreciated that keeper plates created using such a process may be used in the contactor card assembly 1000 of the present invention, and as such fall within the scope of the present invention.

Figure 9:
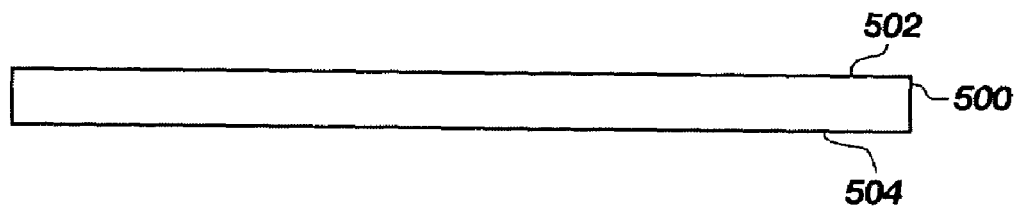
FIG. 9 is a side view of a substrate useful for forming an intermediate portion of a conductor card assembly in accordance with the principles of the present invention.
Figure 11:
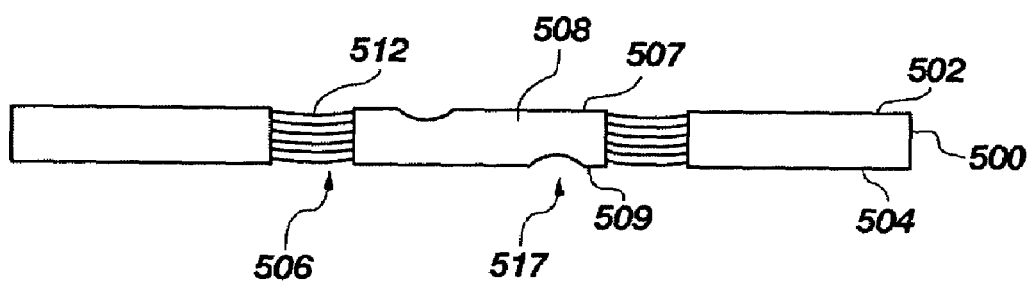
FIG. 11 is a side view of the substrate of FIG. 10 having an elastomer deposited in the channel thereof, in accordance with one embodiment of the present invention.
Figure 10:
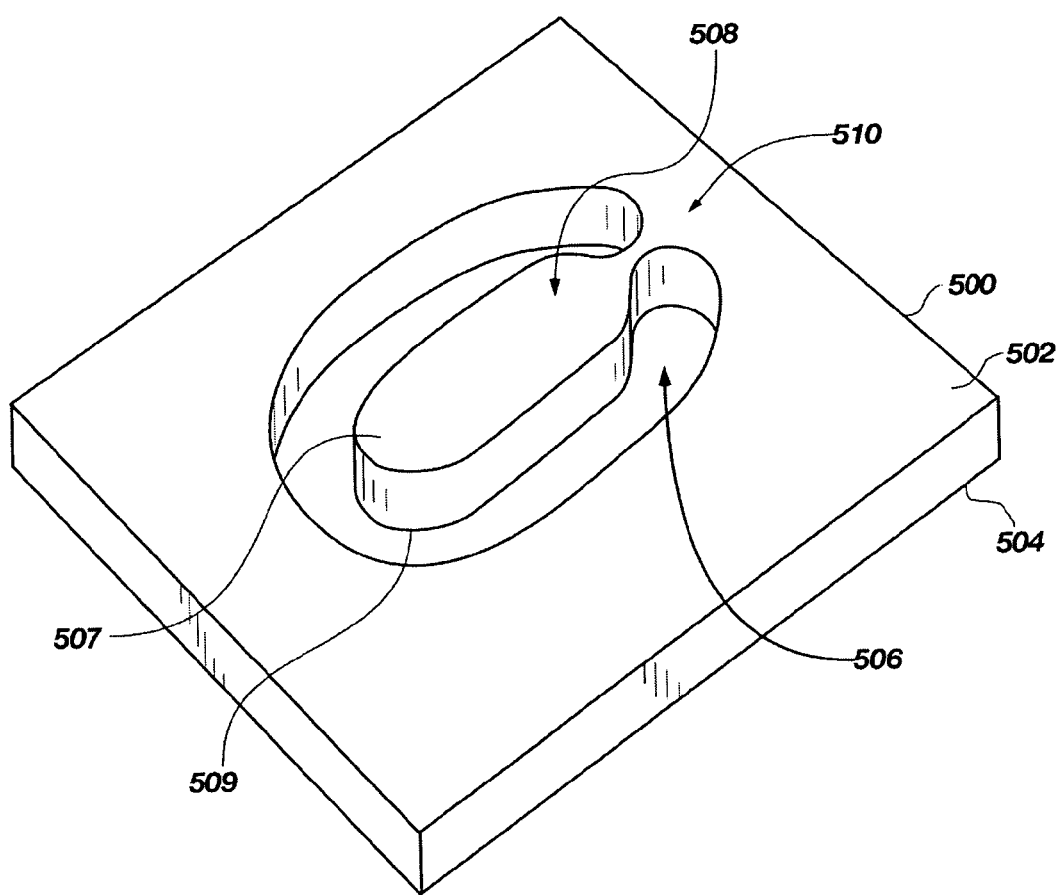
FIG. 10 is a perspective view of the substrate of FIG. 9 showing a channel formed therein, in accordance with the principles of the present invention.

Illustrated in drawing FIGS. 9 through 11 is a procedure for manufacturing an intermediate keeper plate 140 including a pivot bar 142 in accordance with the principles of the present invention. It will be appreciated that while illustrative of one embodiment of the present invention, other methods and procedures may also be used and all such methods are within the scope of the present invention.

An electrically conductive substrate 500 is illustrated in drawing FIG. 9. The electrically conductive substrate 500 may be a planar substrate having a top surface 502 and a bottom surface 504. Suitable electrically conductive planar substrates may be constructed from metals. For example, a section of a metal foil may be provided. Other electrically conductive substrates 500 may be constructed from electrically conductive polymers, conductor-filled polymers, other electrically conductive materials and combination thereof.

As illustrated in drawing FIG. 10, a channel 506 may be cut through electrically conductive substrate 500 to substantially surround a bar 508. The bar 508 may remain attached to the substrate 500 through a small tab 510 of material, with channel 506 surrounding the remainder of the bar 508. Bar 508 may have any desired shape and any desired longitudinal axis. For example, bar 508 may be circular, oval, rectangular, square, a regular polygon, or irregularly shaped, as is desired for the specific usage. The upper surface 507 and lower surface 509 of bar 508 may remain substantially planar, or a rounded divot 517 (FIG. 11) may be placed therein for an electrically conductive contact pin 430 (FIG. 8) to slide along in a guided manner.

Channel 506 may be cut through substrate 500 in any suitable manner. For example, where a metal foil is provided as the substrate 500, channel 506 may be cut with a micromachining laser, such as the aforementioned Xsil micromachining laser, or formed by etching the foil with a suitable etchant. Where needed, the channel 506 may be cleaned to remove any debris that would interfere with the motion electrical isolation of the bar 508. At this point the bar 508 (and substrate 500, if desired) may be plated to improve surface hardness or conductivity. A solder mask material may be used to selectively plate the bars 508.

A non-conductive elastomeric material 512 may then be disposed in the channel 506 around the bar 508 attaching it to the substrate 500. The upper surface 507 and lower surface 509 of bar 508 may remain free of the non-conductive elastomeric material 512. The non-conductive elastomeric material 512 electrically isolates the bar 508 from the surrounding substrate, reducing current leaking during testing and burn-in. Any suitable non-conductive elastomeric material may be used. For example, liquid silicone may be dispensed into the channel 506. Other suitable non-conductive elastomers may include flexible polymeric materials with electrically insulative properties and flexible insulative epoxies.

The non-conductive elastomeric material 512 may be dispensed in channel 506 in any suitable fashion. For example a liquid material may be dispensed directly into the channel 506, where the substrate 500 is placed on a support plate providing a bottom for the channel. For example, a Teflon-coated plate would provide a bottom that liquid silicone would not adhere to, allowing release. In another example, tape may be applied over the channel and the contact portion of the bar 508, which may be removed upon dispensing or curing of the elastomeric material 512. Where the non-conductive elastomeric material 512 is of suitable viscosity, no support may be required. Where the non-conductive elastomeric material 512 is gelatinous, or a higher viscosity fluid, the material may be dispensed on the upper surface 502 of the substrate 500 and then disposed in one or more channels 506 by a squeegee or other scraper.

Once the non-conductive elastomeric material 512 is disposed in the channel 506, it may be cured in any suitable fashion. For example, the part may be heated to cure the material, or exposed to a specific wavelength of light to photoset a photoactive material. Once the elastomeric material 512 is cured, the tab 510 may be removed to allow the bar 508 to pivot. Tab 510 removal may occur by laser ablation, etching or as otherwise known to those of ordinary skill in the art. Where tape is applied to protect the pivot bar 508 through dispensing or handling, the tape may be left on during tab 510 removal to protect the pivot bar 508 and elastomeric material 512 from slag and damage incurred during tab 510 removal and then removed.

It will be appreciated that modifications to the process outlined above may be made by those of ordinary skill in the art. For example, a non-conductive substrate 500 may be used with vias formed therein and a conductive bar 508 placed therein to further reduce the possibility of current leakage. In other embodiments, the substrate 500 may be provided by building up a substrate 500 containing the channel through a plating process, such as nickel plating an appropriate mandrel, or stacking of thick-film tab tape or fab metal. A three dimensional plated build up process, such a photolithography, or a controlled plating process may be used.

An entire contactor card assembly, such as that illustrated as 1000 in drawing FIGS. 1 through 3, may be assembled from an intermediate keeper plate 140, and upper and lower keeper plates 100 and 120. The contact force of the electrically conductive contact pins 104 and 124 may be controlled for the desired application by varying the thickness of the keeper plates, the diameter of the pins 104 and 124, the diameter of the pin holes 412, the shape of the bar 508 and the resiliency of the cured elastomeric materials.

In other embodiments of the invention, a keeper plate 420 may be attached to a wafer or die that has solder disposed on the electrical contacts thereof, or an assembly of wafers or dice with solder disposed on the electrical contacts thereof to form a stacked assembly with resilient contacts. This may also be accomplished with the complete assembly, including upper, lower and intermediate keeper plates to avoid the need to form insulated vias in a package. Such an assembly may be able to undergo testing and burn-in through the attached contactor assembly. The flexible compliant contacts, formed as discussed previously herein, may be used in other semiconductor related structures. This may be useful in any application where contact is to be made with a array of contacts that may have variations in contact height. For example, the contacts currently used in burn-in and test head sockets may be replaced by the compliant connectors to add a degree of flexibility to the contacts.

It will be apparent that details of the apparatus, processes, and methods herein described can be varied considerably without departing from the concept and scope of the invention. The claims alone define the scope of the invention as conceived and as described herein.

What is claimed is:

1. A probe card for contacting a portion of a semiconductor substrate, the probe card comprising:
    an upper keeper plate comprising a first substantially planar substrate having at least one upper via extending therethrough, at least a first electrically conductive upper contact pin partially embedded in and extending through an elastomeric material disposed in the at least one upper via;
    a lower keeper plate comprising a second substantially planar substrate having at least one lower via extending therethrough, at least a first electrically conductive lower contact pin partially embedded in and extending through an elastomeric material disposed in the at least one lower via; and
    an intermediate keeper plate comprising a third substantially planar substrate having at least one electrically conductive pivot bar disposed in an at least a first channel located in the third substantially planar substrate, the at least one electrically conductive pivot bar attached to the third substantially planar substrate by an elastomeric material disposed in the at least a first channel for the at least one conductive pivot bar to move in the at least a first channel in response to a force placed thereupon.

2. The probe card of claim 1, wherein a first end of the at least a first electrically conductive upper contact pin contacts a first surface of the at least one electrically conductive pivot bar.

3. The probe card of claim 2, wherein a first end of the at least a first electrically conductive lower contact pin contacts a second surface of the at least one electrically conductive pivot bar.

4. The probe card of claim 2, wherein the first surface of the at least one electrically conductive pivot bar contains a groove to guide the first end of the at least a first electrically conductive upper contact pin during movement of the at least one electrically conductive pivot bar.

5. The probe card of claim 1, wherein the at least a first electrically conductive upper contact pin is removable from the elastomeric material in which it is embedded to allow replacement thereof.

6. The probe card of claim 1, wherein the at least a first electrically conductive lower contact pin is removable from the elastomeric material in which it is embedded to allow replacement thereof.

7. The probe card of claim 1, wherein the elastomeric material disposed in the at least one upper via, the at least one lower via and the at least a first channel comprises an electrically non-conductive material.

8. The probe card of claim 7, wherein the elastomeric material disposed in the at least one upper via, the at least one lower via and the at least a first channel comprises silicone.

9. The probe card of claim 1, wherein the first substantially planar substrate comprises a semiconductor wafer.

10. The probe card of claim 1, wherein the second substantially planar substrate comprises a semiconductor wafer.

11. The probe card of claim 1, wherein the third substantially planar substrate comprises a metal foil.

12. The probe card of claim 1, wherein the at least one electrically conductive pivot bar is attached to the third substantially planar substrate by a flexible elastomer surrounding the at least one electrically conductive pivot bar for having only a top surface and bottom surface of the at least one electrically conductive pivot bar exposed.

13. A variable contact plate for an assembly for contacting a plurality of semiconductor contacts of a semiconductor substrate, comprising:
    a substrate having a first substantially planar surface and an opposite second substantially planar surface;
    at least a first channel located in the substrate, passing from the first substantially planar surface and the opposite second substantially planar surface;
    at least a first electrically conductive pivot bar disposed in the at least a first channel; and
    a resilient elastomer disposed in the at least a first channel flexibly retaining the at least a first electrically conductive pivot bar therein to allow the at least a first electrically conductive pivot bar to move in the at least a first channel in response to a force placed thereupon.

14. The variable contact plate of claim 13, wherein the substrate comprises a section of metallic foil.

15. The variable contact plate of claim 13, wherein the substrate is non-electrically conductive and the resilient elastomer comprises an electrically conductive material.

16. The variable contact plate of claim 15, wherein the substrate is electrically conductive and the resilient elastomer comprises an electrically non-conductive material.

17. The variable contact plate of claim 15, wherein the resilient elastomer comprises silicone.

18. The variable contact plate of claim 15, further comprising:
    at least a second channel located in the substrate, passing from the first substantially planar surface and the opposite second substantially planar surface;
    at least a second electrically conductive pivot bar disposed in the at least a second channel; and
    a resilient elastomer disposed in the at least a second channel flexibly retaining the at least a second electrically conductive pivot bar therein to allow the at least a second electrically conductive pivot bar to move in the at least a second channel in response to a force placed thereupon.

19. The variable contact plate of claim 15, wherein the at least a first electrically conductive pivot bar comprises a material substantially similar to a material of the substrate.

20. The variable contact plate of claim 15, wherein the at least a first electrically conductive pivot bar comprises a polygonal shape.

21. The variable contact plate of claim 15, wherein the resilient elastomer disposed in the at least a first channel flexibly retaining the at least a first electrically conductive pivot bar therein comprises surrounding the at least a first electrically conductive pivot bar with the resilient elastomer having only a top surface and bottom surface of the at least a first electrically conductive pivot bar exposed.

22. The variable contact plate of claim 21, wherein the at least a first electrically conductive pivot bar has a groove located on the top surface to provide a guide for a contact pin to slide therein.

23. The variable contact plate of claim 21, wherein the at least a first electrically conductive pivot bar includes a groove located on the bottom surface to provide a guide for a contact pin to slide therein.

* * * * *

UNITED STATES PATENT AND TRADEMARK OFFICE
CERTIFICATE OF CORRECTION

PATENT NO. : 7,167,010 B2  Page 1 of 1
APPLICATION NO. : 10/933745
DATED : January 23, 2007
INVENTOR(S) : David R. Hembree It is certified that error appears in the above-identified patent and that said Letters Patent is hereby corrected as shown below:

In the specification:
COLUMN 4, LINE 18, change "(UMB)" to --(UBM)--

In the claims:
CLAIM 16, COLUMN 10, LINE 24, change "claim 15," to --claim 13,--
CLAIM 17, COLUMN 10, LINE 27, change "claim 15," to --claim 13,--
CLAIM 18, COLUMN 10, LINE 29, change "claim 15," to --claim 13,--
CLAIM 19, COLUMN 10, LINE 42, change "claim 15," to --claim 13,--
CLAIM 20, COLUMN 10, LINE 45, change "claim 15," to --claim 13,--
CLAIM 21, COLUMN 10, LINE 48, change "claim 15," to --claim 13,--

Signed and Sealed this

Twentieth Day of November, 2007

JON W. DUDAS
*Director of the United States Patent and Trademark Office*